(12) United States Patent
Mukai

(10) Patent No.: US 6,927,990 B2
(45) Date of Patent: Aug. 9, 2005

(54) SEMICONDUCTOR MEMORY DEVICE, ELECTRONIC CARD AND ELECTRONIC DEVICE

(75) Inventor: Hideo Mukai, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 191 days.

(21) Appl. No.: 10/620,849

(22) Filed: Jul. 16, 2003

(65) Prior Publication Data

US 2004/0057266 A1 Mar. 25, 2004

(30) Foreign Application Priority Data

Jul. 16, 2002 (JP) .................................. 2002-207383

(51) Int. Cl.[7] .................................................. G11C 5/06
(52) U.S. Cl. ............................ 365/63; 365/51; 365/205
(58) Field of Search .......................... 365/63, 51, 205, 365/185.17

(56) References Cited

U.S. PATENT DOCUMENTS 5,917,744 A * 6/1999 Kirihata et al. ............... 365/63
6,067,249 A    5/2000 Lee et al.

* cited by examiner

Primary Examiner—David Lam
(74) Attorney, Agent, or Firm—Hogan & Hartson, LLP

(57) ABSTRACT

A semiconductor memory device comprises a cell array including bit lines arranged at a uniform pitch; and a plurality of bit line selection transistors connected to respective bit line ends for selectively connecting the bit line to a sense amp. The bit line selection transistors are translationally arrayed in a direction perpendicular to the bit line at an average array pitch greater than eight times the pitch of the bit lines.

23 Claims, 14 Drawing Sheets

SEMICONDUCTOR MEMORY DEVICE, ELECTRONIC CARD AND ELECTRONIC DEVICE

CROSS REFERENCE TO RELATED APPLICATIONS

This application is based upon and claims the benefit of priority from the prior Japanese Patent Application No. 2002-207383, filed on Jul. 16, 2002; the entire contents of which are incorporated herein by reference.

BACKGROUND OF THE INVENTION

1. Field of the Invention

The present invention relates to a semiconductor memory device, and more particularly to an electrically erasable programmable non-volatile semiconductor memory (EEPROM) having bit line selection transistors arranged at a cell array end.

2. Description of the Related Art

In a mass NAND-type EEPROM configuration, bit lines arranged at a fine pitch are divided into odd and even ones, and either one of them is selectively connected to a sense amp. In this case, bit line selection transistors are arranged in a cell array at bit line ends to select odd and even bit lines.

FIG. 13 shows a configuration covering from a cell array 1 to a sense amp 2 in such the NAND-type EEPROM, focusing attention on odd bit lines BLo (BLo0<k>–BLo7<k>) and adjacent even bit lines BLe (BLe0<k>–BLe7<k>). There is an arrangement region 3 for bit line selection transistors Q0–Q15 between the cell array 1 and the sense amp 2. The cell array 1 comprises NAND cell units U arrayed. Each unit includes plural (16 in the shown example) non-volatile memory cells MC0–MC15 serially connected. Each NAND cell unit U has one end connected to the bit line BLo or BLe via a selection transistor S1 and the other end connected to a common source line CELSRC via a selection transistor S2.

The memory cells MC0–MC15 have control gates respectively connected to word lines WL0–WL15, which are arranged to intersect the bit lines BLo and BLe. The selection transistors S1 and S2 have gates connected to selection gate lines SGD and SGS, which are arranged in parallel with the word lines. The ends of the bit lines BLo and BLe in the cell array are connected, via the bit line selection transistors controllable by selection signals BLSo and BLSe, to common sensing bit lines SBL, which are connected to the sense amp 2. For example, the bit lines BLo0<k> and BLe0<k> are connected via the bit line selection transistors Q0 and Q1 to the common sensing bit line SBL0<k>.

The bit line selection transistors Q0–Q15 are required to consist of a high voltage transistor because a high erasing voltage is applied to the bit line during data erase. This situation is specifically described. When data is written in the NAND-type EEPROM, the p-type well is held at 0V and a write voltage of approximately 20V is applied to the selected word line to inject electrons from the channel region into the floating gate of the selected memory cell. This results in a higher threshold of the memory cell in a written state (for example, the state of "0" data). On the other hand, data is erased in a block batch of cells sharing the p-type well. During data erase, while all word lines in the cell block are held at 0V and the bit lines are floated, an erase voltage of approximately 20V is applied to the p-type well to discharge the charges from inside the floating gate of the memory cell to the substrate. This results in a lower threshold of the memory cell in an erased state.

During data erase, the n-type diffusion layer connected to the bit line is forward biased relative to the p-type well. Therefore, the erase voltage of 20V may appear even on the floating bit line. The bit line selection transistors are formed in another p-type well different from the p-type well in the cell array 1, and are isolated from the p-type well in the cell array 1. When the voltage on the bit line is elevated up to 20V, however, a junction breakdown may possibly arise between the n-type source/drain diffusion layer of the bit line selection transistor and the p-type well, resulting in destruction of peripheral circuits. For the purpose of protection of the peripheral circuits, the bit line selection transistor should consist of a high voltage transistor.

As described above, the need for the high-voltage bit line selection transistors may add constrains to downsize them. Therefore, when the bit lines are arranged at a much finer pitch in the cell array 1, the layout of bit line selection transistors causes a problem.

SUMMARY OF THE INVENTION

The present invention has been made in consideration of such the situation and accordingly has an object to provide a semiconductor memory device capable of arranging bit line selection transistors without reduction of the area efficiency. An electronic card including the memory device mounted thereon is also provided, as well as an electronic device utilizing the electronic card.

An aspect of the semiconductor memory device according to the present invention comprises a cell array including bit lines arranged at a uniform pitch; and a plurality of bit line selection transistors connected to respective bit line ends for selectively connecting the bit line to a sense amp. The bit line selection transistors are translationally arrayed in a direction perpendicular to the bit line at an average array pitch greater than eight times the pitch of the bit lines.

Another aspect of the semiconductor memory device according to the present invention comprises a cell array including bit lines arranged at a uniform pitch; and a plurality of bit line selection transistors connected to respective bit line ends for selectively connecting the bit line to a sense amp. The bit line selection transistors are translationally arrayed in a direction perpendicular to the bit line at an average array pitch deviated from an integer multiple of the pitch of the bit lines.

BRIEF DESCRIPTION OF THE DRAWINGS

The present invention will be more fully understood from the following detailed description with reference to the accompanying drawings, in which.

DETAILED DESCRIPTION OF THE EMBODIMENTS

Figure 13:
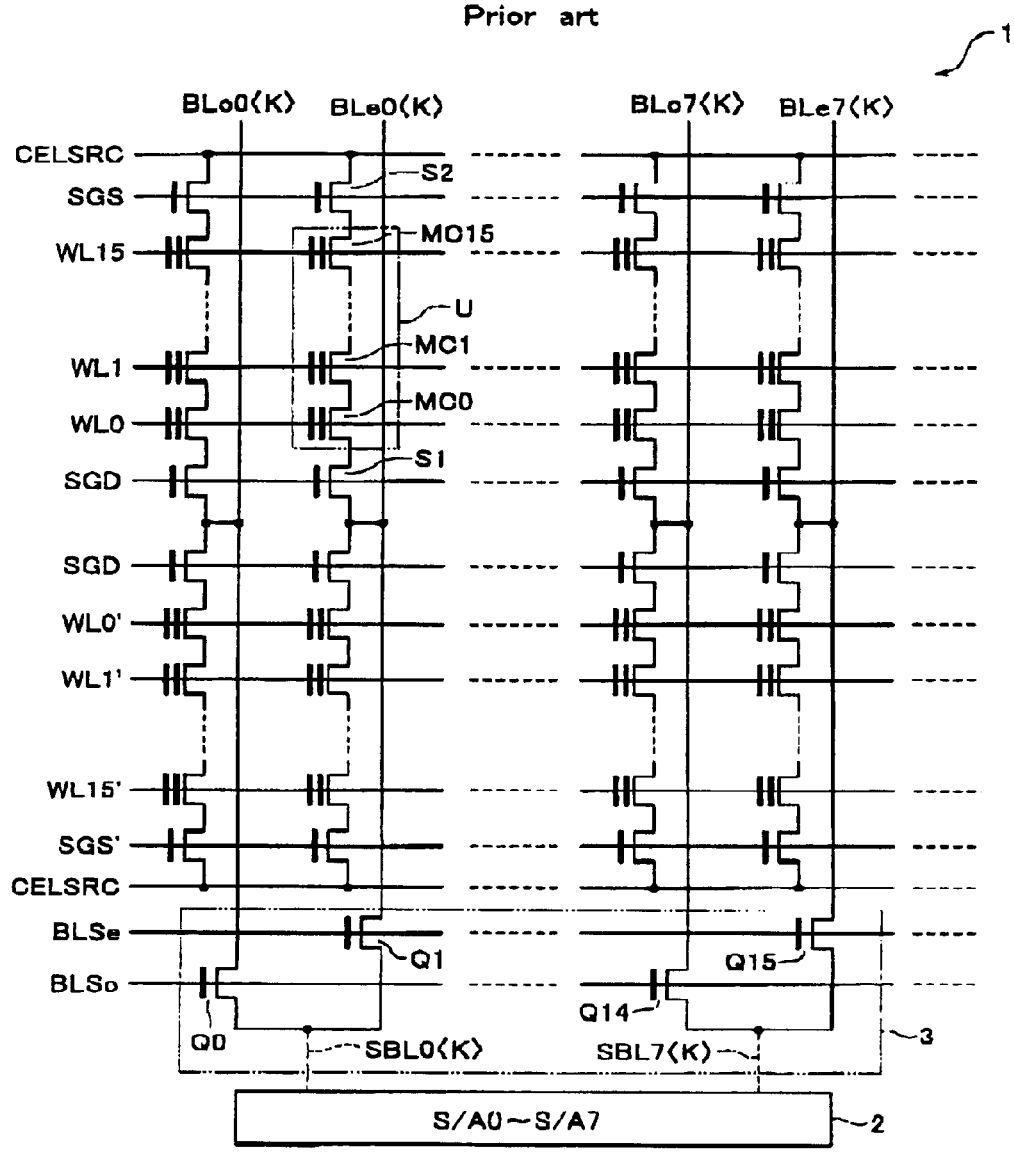
FIG. 13 shows a cell array arrangement in a NAND-type EEPROM in the art.

A NAND-type EEPROM according to an embodiment of the present invention will be described below with reference to the drawings. This EEPROM includes a cell array similar to the cell array 1 in FIG. 13. As shown in FIG. 13, the cell array 1 has a matrix arrangement that includes plural (16 in the shown example) non-volatile memory cells MC0–MC15 serially connected to form a NAND cell unit U, each pair of adjacent cells sharing a common source/drain diffusion layer. Each NAND cell unit U has one end connected to the bit line BLo or BLe via the selection transistor S1 and the other end connected to the common source line CELSRC via the selection transistor S2. The memory cells MC0–MC15 have respective control gates connected to the word lines WL0–WL15 that are arranged to intersect the bit lines BLo, BLe. The selection transistor S1, S2 have respective gates connected to the selection gate lines SGD, SGS that are arranged in parallel with the word lines.

Figure 14:
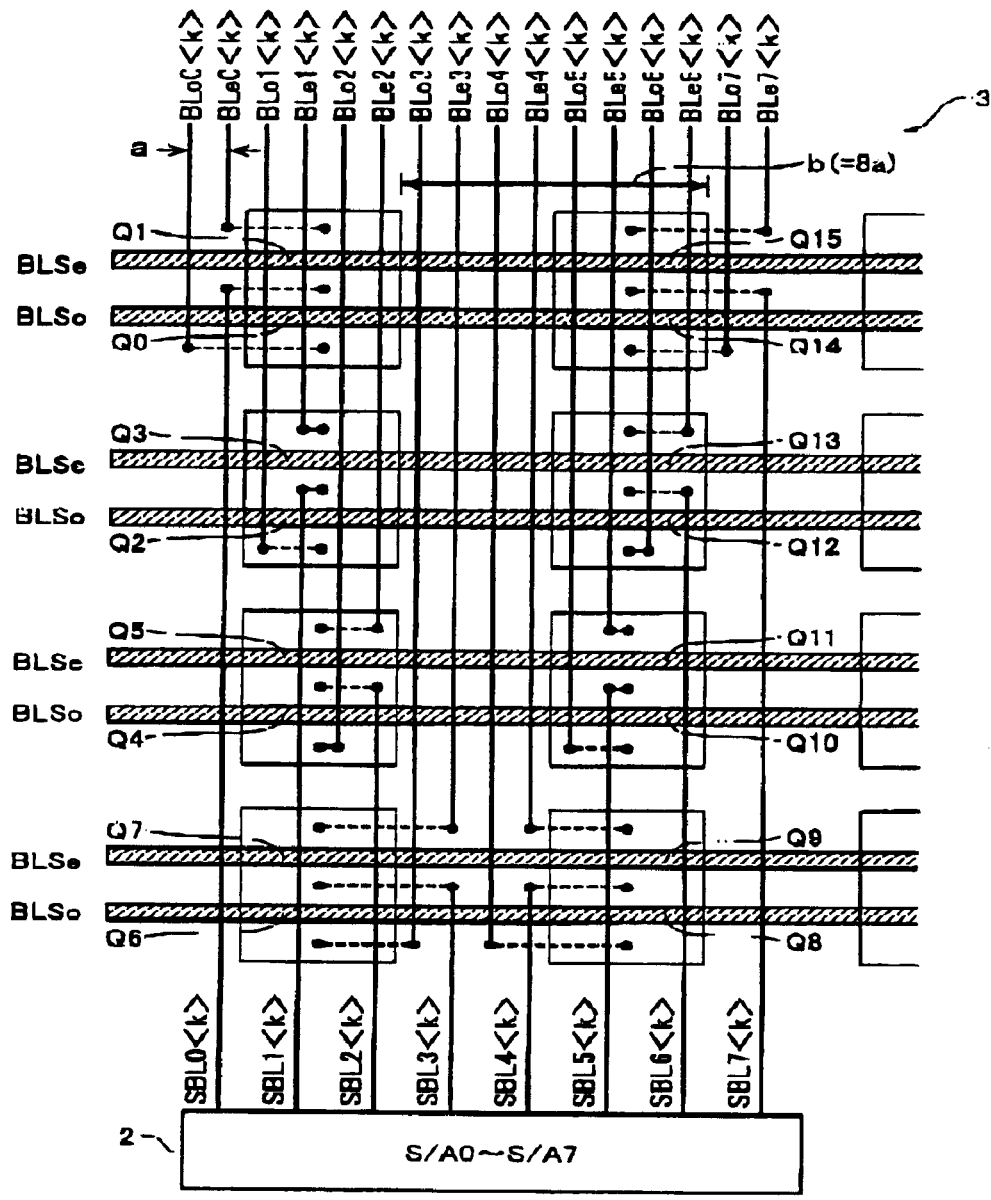
FIG. 14 shows a layout of bit line selection transistors in a NAND-type EEPROM of a comparative example.

To facilitate understanding of the layout of bit line selection transistors according to the embodiment of the invention, a comparative example is described first. FIG. 14 shows an arrangement region 3 for the bit line selection transistors when data input/output is executed on an 8-bit basis at a certain column address <k>. Specifically, it is an exemplary layout showing a total of 16 bit lines including 8 odd and 8 even bit lines, BLo0<k>, BLe0<k>, . . . , BLo7<k>, BLe7<k>; and the corresponding 16 bit line selection transistors Q1–Q15. As shown, the bit line selection transistors are arranged in 2 rows of 8 stages in the bit line direction, each pair of adjacent transistors corresponding to odd and even bit lines, sharing a source/drain diffusion layer. In other words, 8 transistors are arranged in the bit line direction and 2 in a direction intersecting thereto. The bit line selection transistors have gates (hatched) that are continuously patterned in the direction intersecting the bit line for receiving the selection signals BLSo, BLSe.

The bit line selection transistors on 8 stages are arranged at a pitch corresponding to 8 bit lines, b (=8a), where a defines a bit line pitch. For each pair of transistors sharing a common diffusion layer, the common diffusion layer is connected to the respective one of sensing bit lines SBL0–SBL7. From the bit line selection transistors in 8 stages×2 rows, 8 sensing bit lines SBL0<k>–SBL7<k> are led out and connected to 8 sense amps S/A0–S/A7. These 8 sense amps S/A0–S/A7 provide 8-bit data, which is input/output via I/O buffers simultaneously at one column address.

In the layout of FIG. 14, if the bit line pitch a is further finely patterned, the array pitch of the bit line selection transistors, b=8a, hardly isolates the bit line selection transistors from one another reliably. To the contrary, it can be considered that the bit line selection transistors may have an array pitch of b=16a corresponding to 16 bit lines. In this case, the bit line selection transistors are arranged in one row of 16 stages for 16 bit lines. This arrangement results in a longer period, however, than that required for arrangement of the bit line selection transistors and extremely lowers the chip area efficient.

Figure 1:
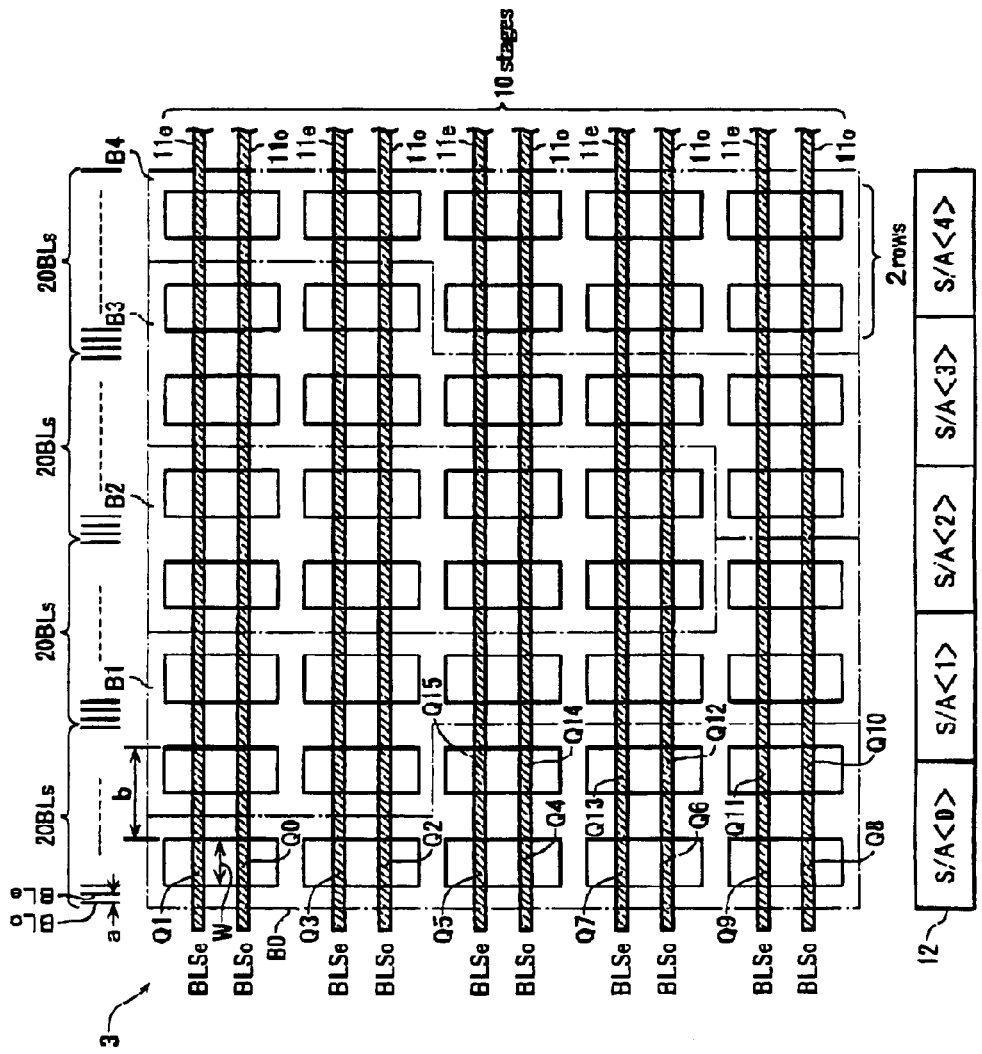
FIG. 1 shows a layout of bit line selection transistors according to an embodiment of the present invention.

On the other hand, FIG. 1 shows a layout of bit line selection transistors in the NAND-type EEPROM according to the embodiment. As shown in the comparative example, the odd and even bit lines BLo, BLe in the cell array are arrayed at the pitch a, and the bit line selection transistors are arranged at the bit line ends in 2 rows of 8 stages for 16 bit lines. To the contrary, FIG. 1 shows an exemplary arrangement of 20 bit lines (20 BLs) in 10 stages×2 rows. The total number of bit lines is generally equal to an integer multiple of 16, or 16n. As is in the embodiment, if the total number of bit lines is equal to 80n, the bit line selection transistors may be arranged in 10 stages×8 rows for every 80 bit lines (20 BLs×4) as shown. The arrangement in n stages×m rows (n, m are integers of 2 or more), such as 10 stages×8 rows, is called a translation arrangement.

This arrangement of the bit line selection transistors is characterized by an average array pitch equal to the bit line pitch multiplied by an integer other than a power of 2 while they are generally arranged at a pitch equal to the bit line pitch multiplied by a power of 2 (for example, 8 times).

The bit line selection transistors are formed in pairs of 2 stages (Q0, Q1), (Q2, Q3), . . . (Q14, Q15), each connected to odd and even bit lines adjacent in the bit line direction, sharing a source/drain diffusion layer. In the bit line selection transistors, a channel width W direction (or gate width direction) is laid out to correspond to a direction perpendicular to the bit line. For the bit line selection transistors arranged in the direction perpendicular to the bit line, their gates are formed as common gate lines 11o, 11e to receive the odd and even bit line selection signals BLSo, BLSe.

In the bit line selection transistors, the array pitch b in the gate width W direction (or gate line direction) may be determined as b=10a. For the bit line selection transistors in 10 stages×8 rows, 16 transistors are required for every 16 bit lines. As shown, the bit line selection transistors are arranged in 5 blocks of 16 transistors, B0–B4, within a range of 80 bit lines. A sense amp row 12 comprises sense amp groups S/A<0>–S/A<4> arranged respectively corresponding to the blocks B0–B4. Each sense amp group includes 8 sense amps. Connected to each sense amp group are 8 sensing bit lines, which are led out of the common source/drain diffusion layers in 16 bit line selection transistors Q0–Q15.

In the example shown in FIG. 1, the total number of the bit lines is equal to an integer multiple of 80, which is the least common multiple associated with 16 and 10. In this case, the bit line selection transistors may be arranged in 10 stages×8n rows, as described above. In addition, the bit line selection transistors may have an array pitch of b=10a. If the total number of the bit lines is not equal to an integer multiple of 80, however, it is generally required to interweave the bit line selection transistors at portions having the number of the stages different from 10 stages.

Figure 2:
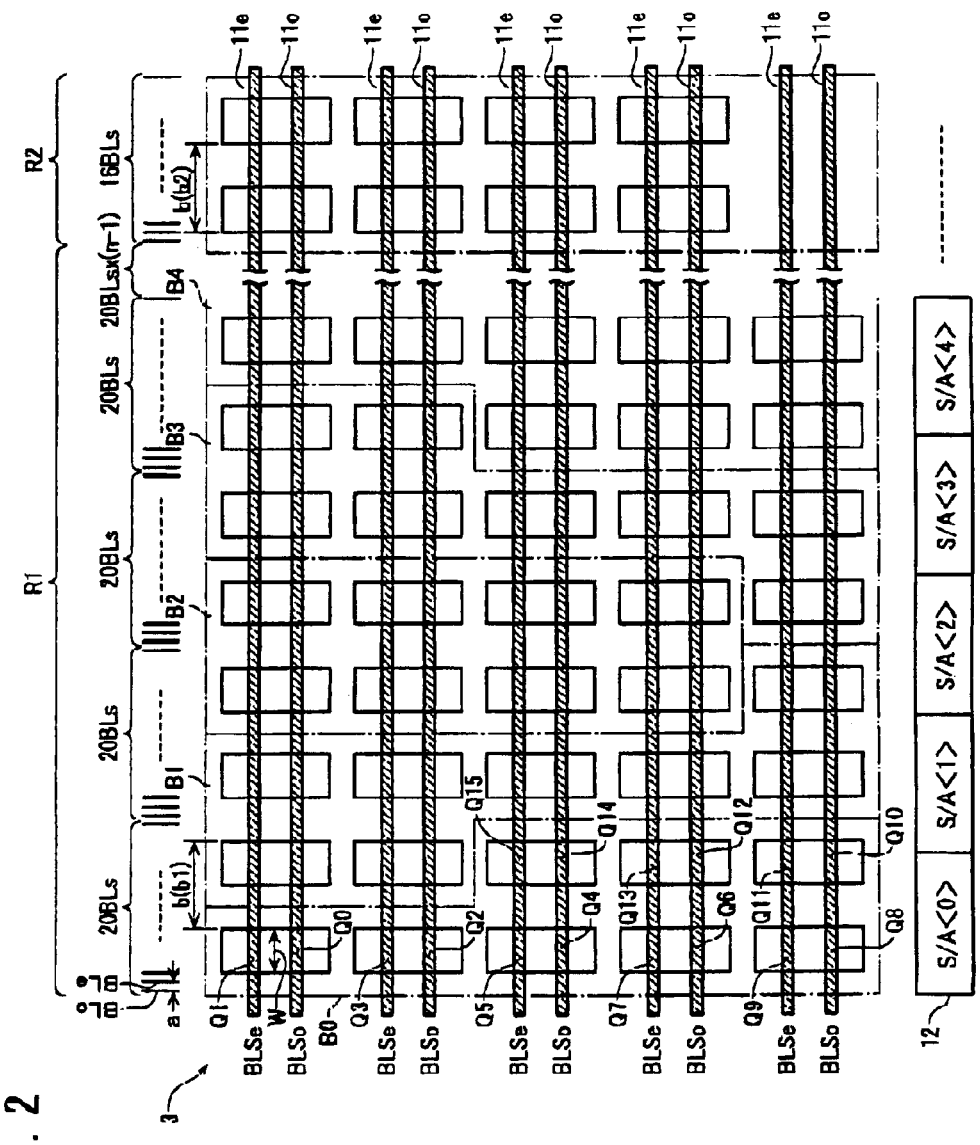
FIG. 2 shows a layout of bit line selection transistors according to another embodiment.
Figure 3:
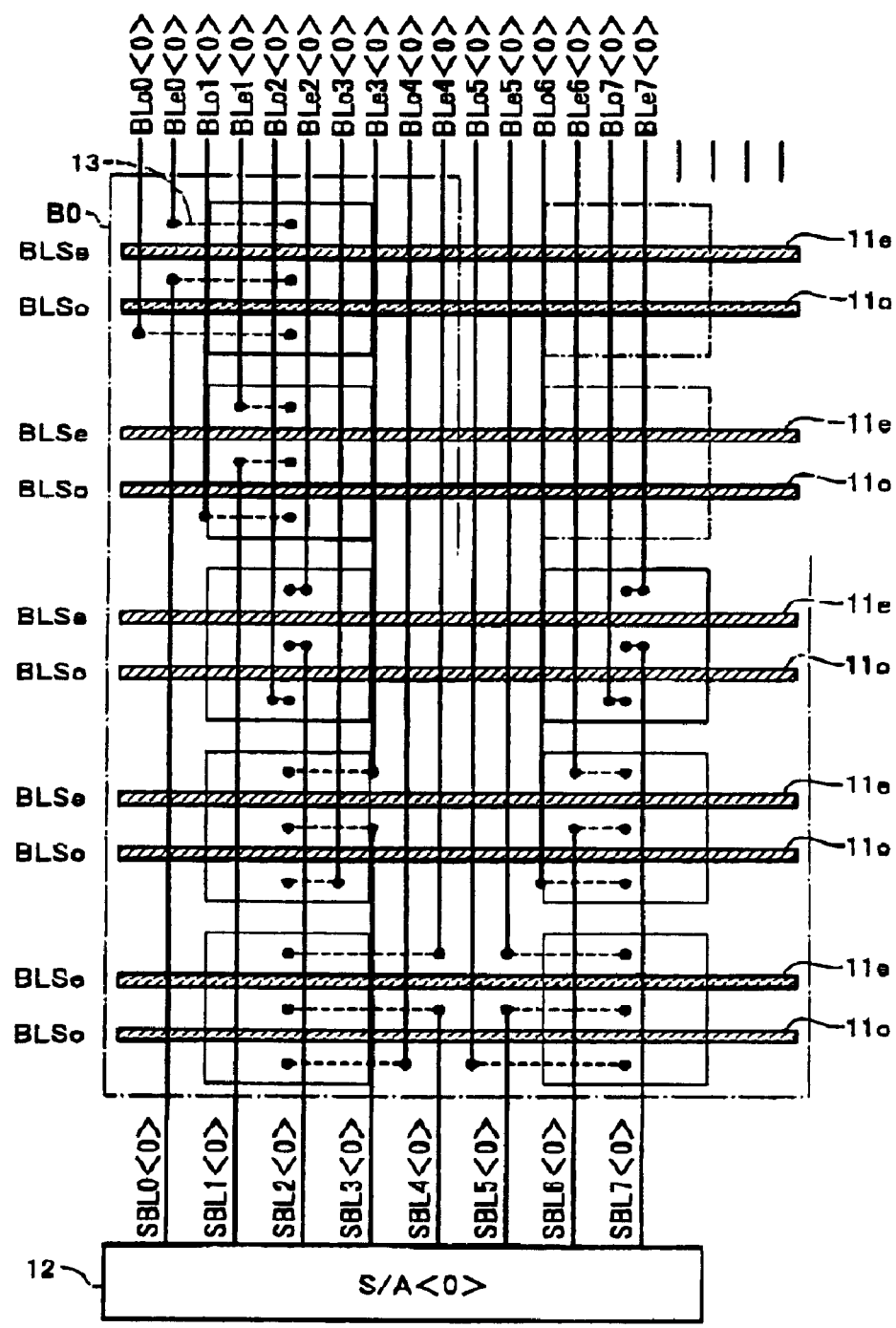
FIG. 3 shows a transistor block B0 in FIG. 2 and its wiring layout.
Figure 4:
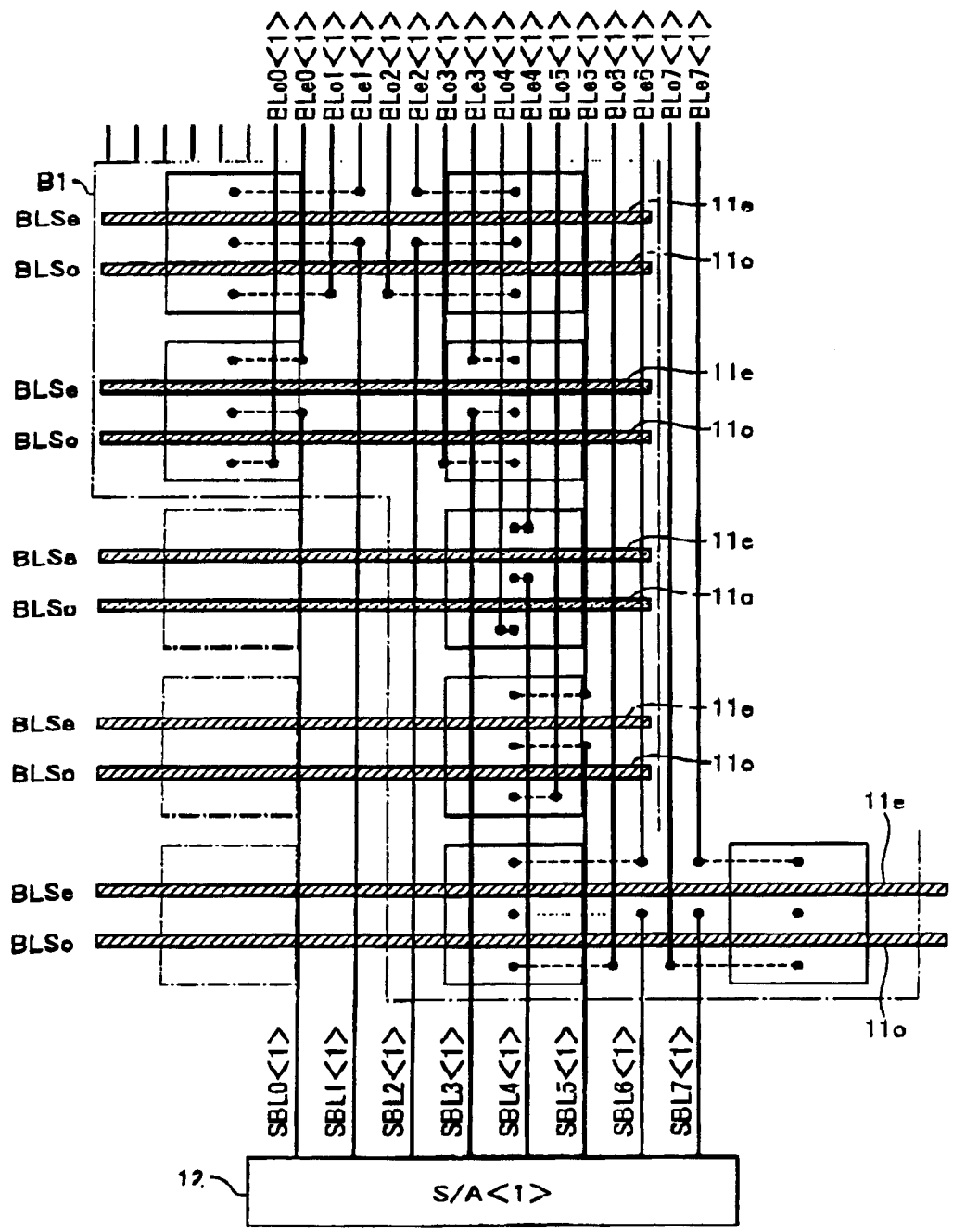
FIG. 4 shows a transistor block B0 in FIG. 2 and its wiring layout.
Figure 5:
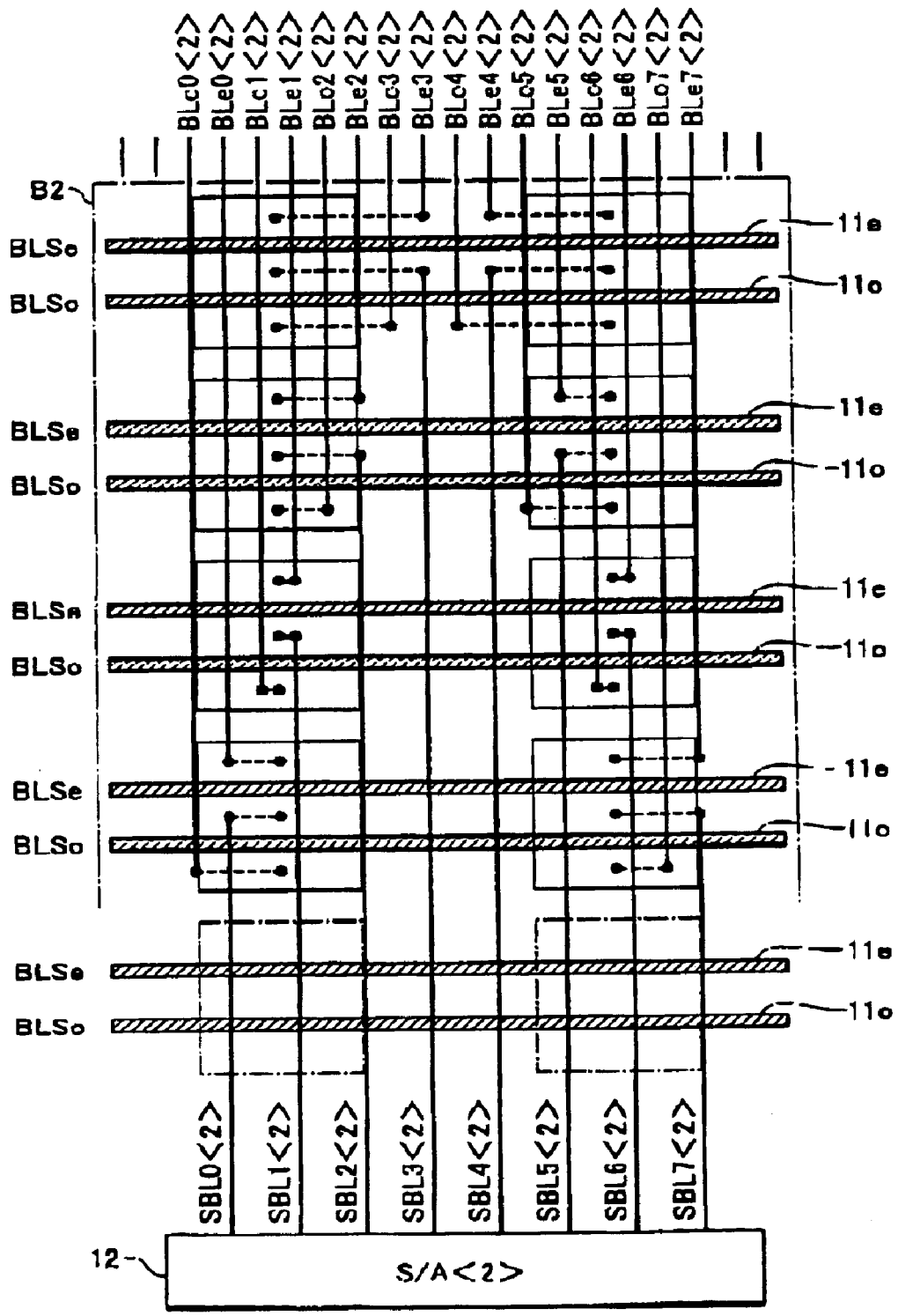
FIG. 5 shows a transistor block B2 in FIG. 2 and its wiring layout.
Figure 6:
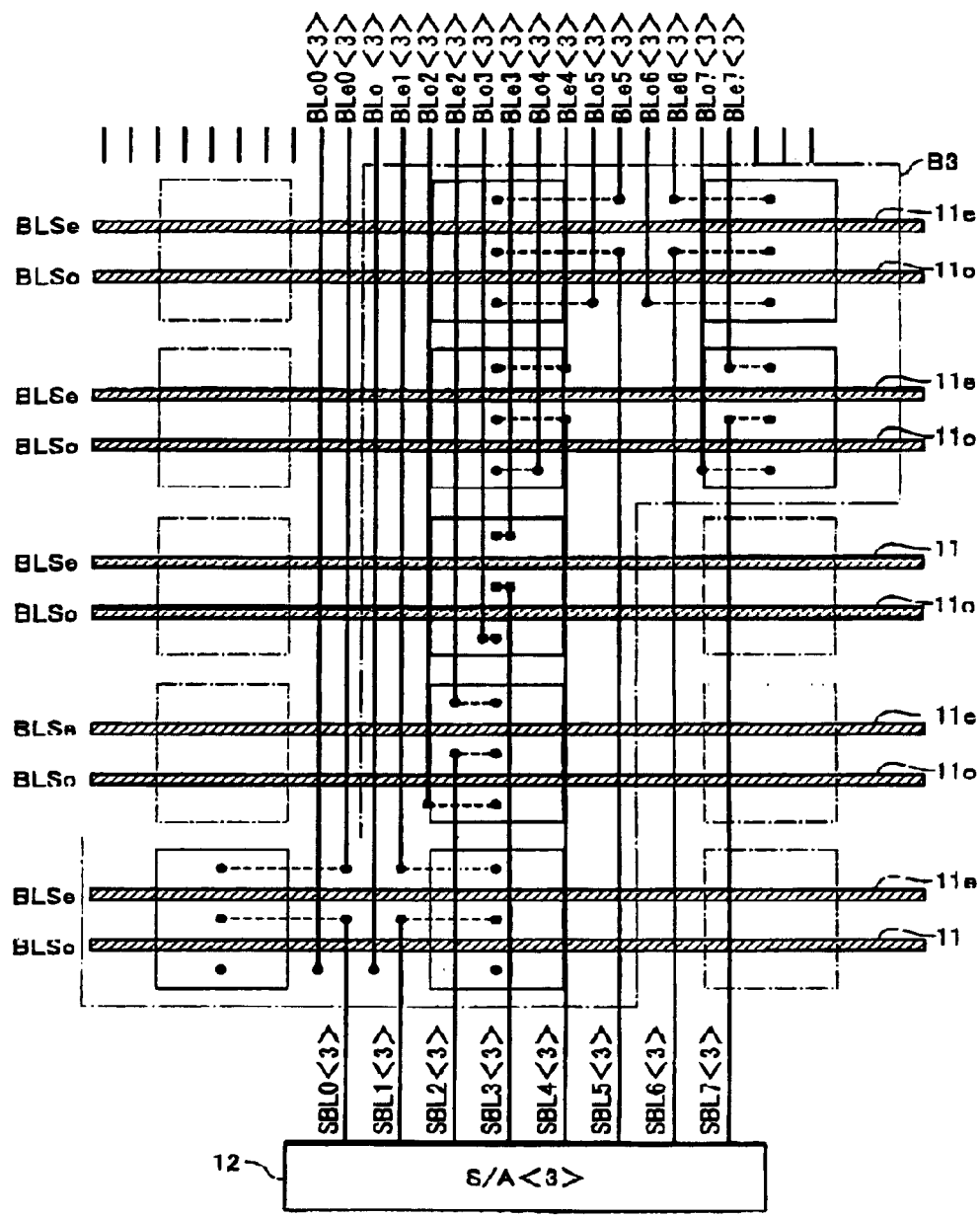
FIG. 6 shows a transistor block B3 in FIG. 2 and its wiring layout.
Figure 7:
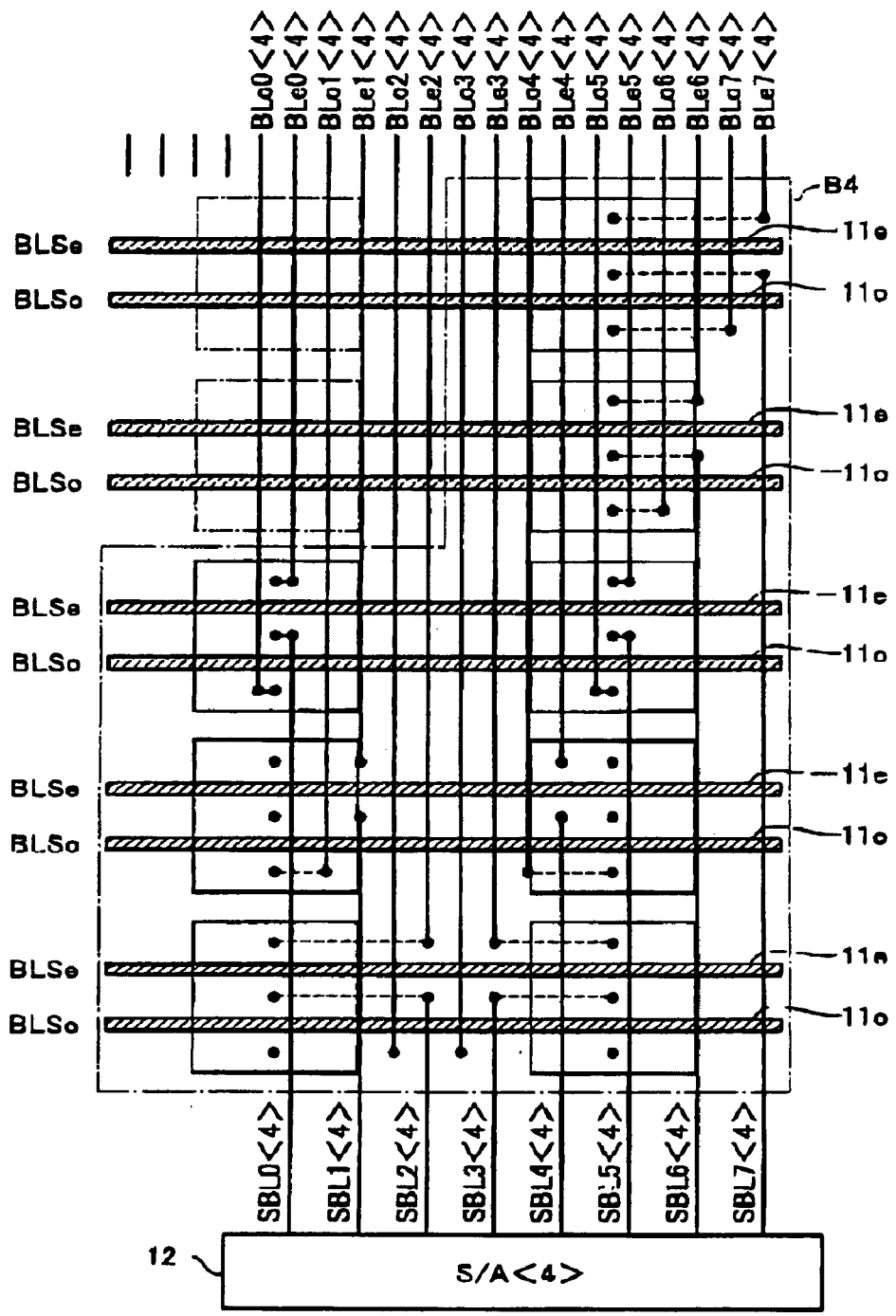
FIG. 7 shows a transistor block B4 in FIG. 2 and its wiring layout.

FIG. 2 shows a layout of the bit line selection transistors, when the total number of the bit lines is equal to 80n+16, corresponding to FIG. 1. In this case, 80n indicates the number of the bit lines arranged in a region R1, and 16 in a region R2. As previously described, within the range for 80n bit lines, the bit line selection transistors can be arranged in 10 stages×2 rows for every 20 bit lines. As for the remaining 16 bit lines, they may be arranged in 8 stages×2 rows. In this case, the array pitch b of the bit line selection transistors in the gate width W direction may be constant over the whole but is not required to be constant. For example, the bit line selection transistors may be arranged in the direction perpendicular to the bit line at two or more different array pitches. As shown in FIG. 2, in the region R1 for every 20 bit lines, an average transistor array pitch is represented by $b1=10a-\alpha/4n$, and in the region R2 for 16 bit lines, it is represented by $b2=8a+\alpha$. The bit line selection transistors have an average array pitch of b, which is represented by (the number of bit lines×a)/the number of transistors. Accordingly, $b=(80n+16)a/(8n+2)=10a-2a/(4n+1)$. In a word, the average array pitch of the bit line selection transistors in the direction perpendicular to the bit line is equal to a value deviated from an integer multiple of the bit line pitch a.

FIGS. 3–7 more specifically show the layout of the bit line selection transistors in FIG. 2 or FIG. 1, including wiring portions, in the respective blocks B0–B4 for every 16 bit lines of the 80 bit lines. FIGS. 3, 4, 5, 6 and 7 focus attention on B0, B1, B2, B3 and B4 in FIGS. 1 and 2, respectively. These blocks B0–B4 correspond to respective column addresses <0>–<4> to input/output 8-bit data at one column address. In each block, the corresponding sense amp group is located. For example, the sense amp group S/A<0> is located in the block B0. The sense amp group includes 8 sense amps.

As shown in FIGS. 3–7, the bit line BLo, BLe is extended and wired from the cell array region to the region of the bit line selection transistor to be connected, and connected to the corresponding source/drain diffusion layer using a lateral wire 13 shown by the dashed line. The lateral wire 13 is a metal wire in a different layer from the bit line BLo, BLe. In relation to the group of 8 sense amps, S/A, the sensing bit lines SBL0–7 are arranged in parallel with the bit lines BLo, BLe in the cell array. They are each connected to a common diffusion layer between a pair of transistors via a lateral wire shown by the dashed line.

Figure 8:
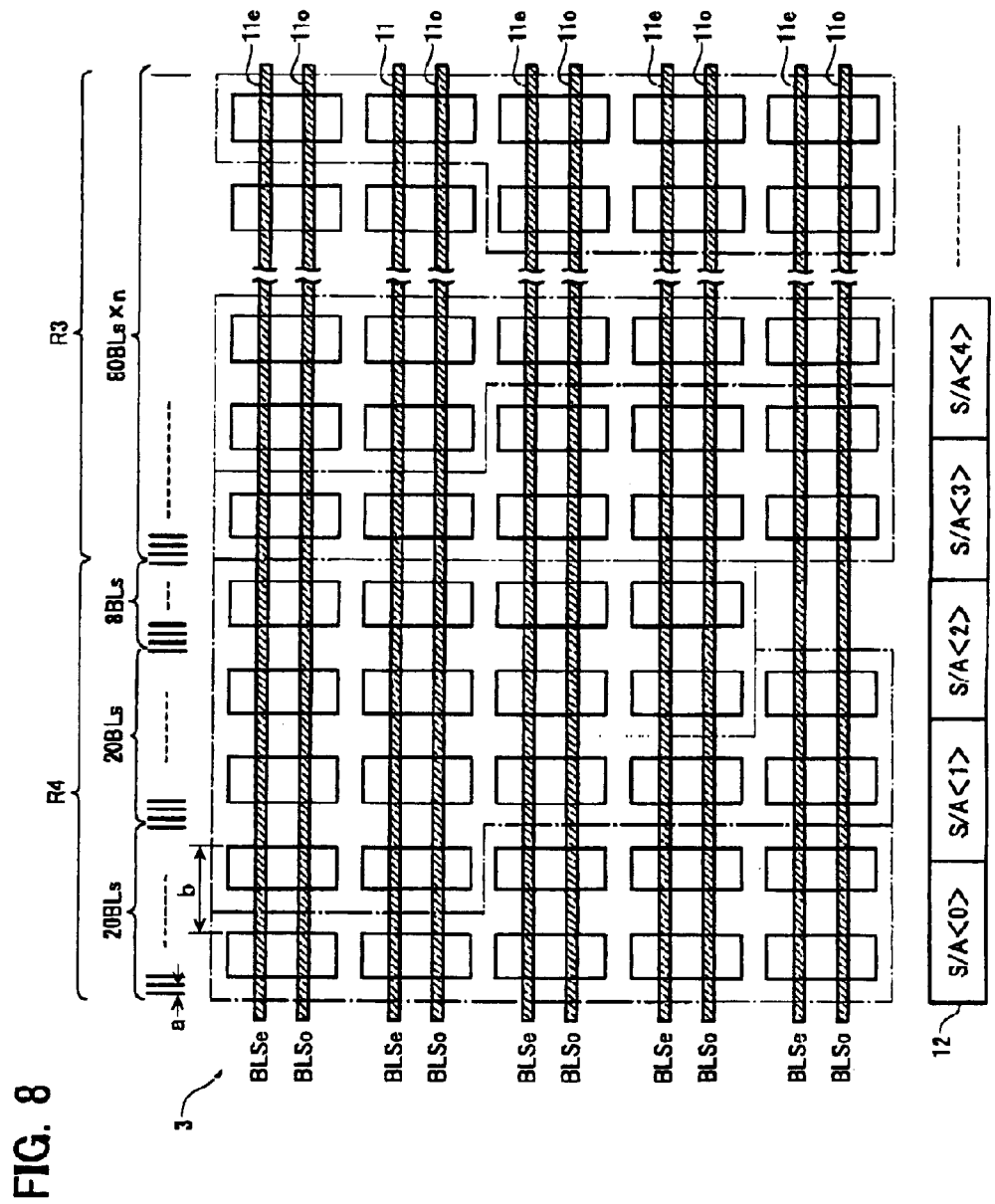
FIG. 8 shows a layout of bit line selection transistors according to another embodiment.

In the example shown in FIG. 2, the total number of the bit lines is equal to 80n+16. Alternatively, the total number of the bit lines may be equal to 80n+32, 80n+48, or 80n+64, for example. In these cases, it is also required to interweave the bit line selection transistors at portions having the number of the stages different from 10 stages. In an example shown in FIG. 8, the total number of the bit lines is equal to 80n+48. In this case, 80n indicates the number of the bit lines arranged in a region R3, and 48 in a region R4. As for the section of the 80n bit lines, except for a delicate deviation in the pitch of the bit line section from that of the transistor section, the bit line selection transistors may be arranged in 10 stages×8n rows as explained in FIG. 1. As for the section of the remaining 48 bit lines, the transistors may be arranged in 10 stages×4 rows+one row of 8 stages as shown in FIG. 8. In this case, the array pitch b of the bit line selection transistors in the gate width direction is represented by $b=(80n+48)a/(8n+5)=10a-2a/(8n+5)$ on average.

Similarly, if the total number of the bit lines is equal to 80n+32, not shown, the transistors are arranged in 10 stages×8n rows+8 stages×4 rows. In this case, the array pitch b of the bit line selection transistors in the gate width direction is represented by $b=10a-2a/(2n+1)$ on average. If the total number of the bit lines is equal to 80n+64, the transistors are arranged in 10 stages×(8n+4) rows+8 stages×3 rows. In this case, the array pitch b of the bit line selection transistors in the gate width direction is represented by $b=10a-6a/(8n+7)$ on average.

In summary, according to this embodiment, the array pitch of the bit line selection transistors in the direction perpendicular to the bit line is more than 8 bit lines and less than 10 bit lines on average. Therefore, this average array pitch of the transistors can be determined to have a value deviated from 10 times or an integer multiple of the bit line pitch. In this case, even if the bit line selection transistors can not be contained within a period of 8 bit lines, they can be arranged with margins. In addition, any useless area is not required as is in the arrangement in a period of 16 bit lines. A higher chip area efficiency can be expected while the transistor arrangement is forced to partially differ in number of stages.

In the preceding embodiments, the pair of the bit line selection transistors connected to the adjacent odd and even bit lines BLo, BLe are laid out to align parallel with the bit line direction. To the contrary, if the transistors are rotated by 90°, the pair of the bit line selection transistors connected to the adjacent odd and even bit lines BLo, BLe may be laid out to align parallel with the direction perpendicular to the bit line direction. In other words, the gate length direction intersects the bit line at right angle. A layout of the bit line selection transistors in such an embodiment is shown in FIG. 9.

Figure 9:
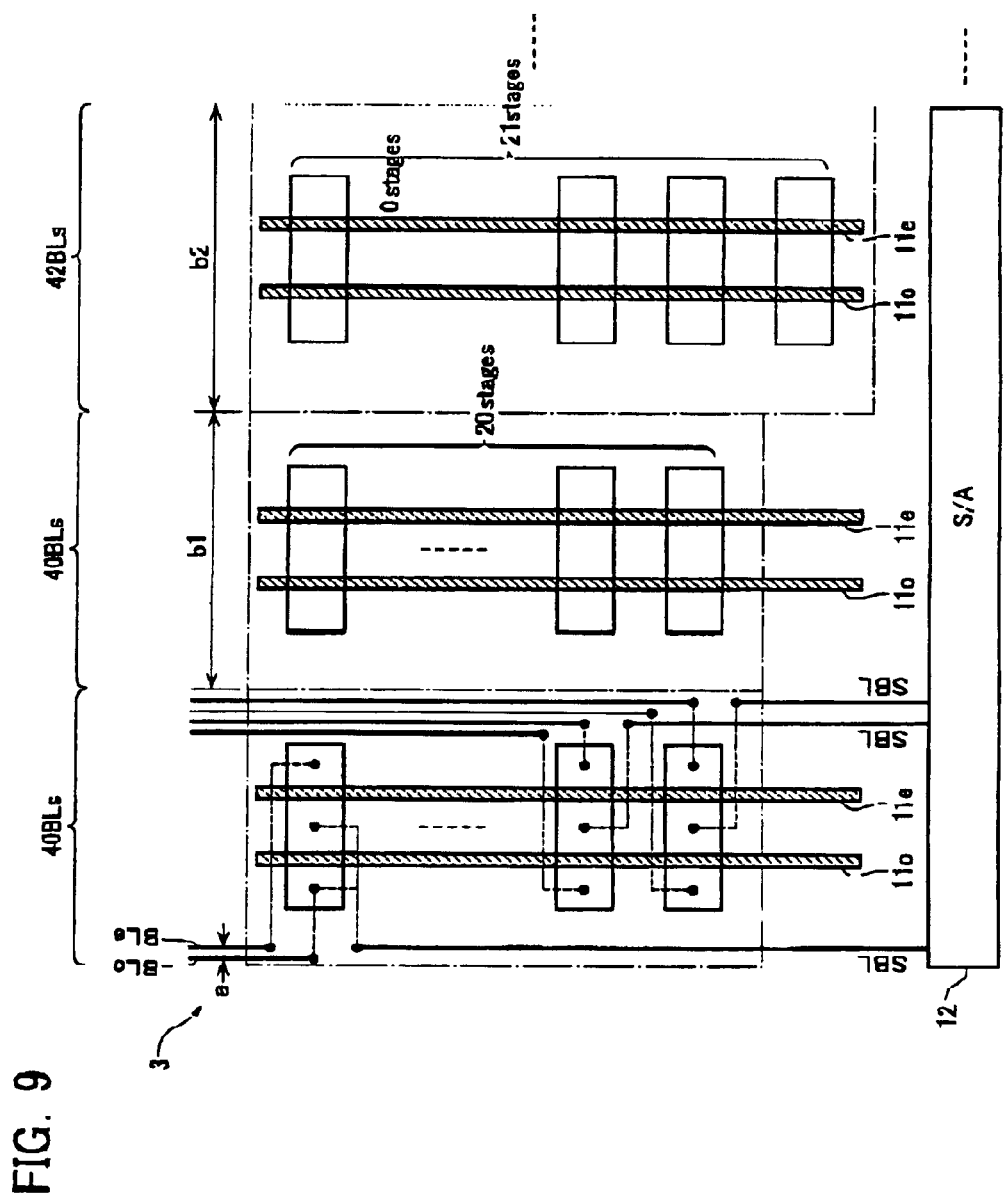
FIG. 9 shows a layout of bit line selection transistors according to another embodiment.

In the example shown in FIG. 9, the width in the gate length direction of the transistor pair can fall within 40 bit lines.

If the total number of the bit lines is equal to an integer multiple of 40, transistor pairs of 20 stages can be arranged within the width of 40 bit lines, b1 (=40a). This is effective to lay out the bit line selection transistors without any useless area. In the example shown in FIG. 9, however, the total number of the bit lines is represented by a sum of an integer multiple of 40 and an integer multiple of 42. In this case, transistor pairs of 21 stages are arranged within the width of 40 bit lines, b2 (=42a). As a result, the array pitch of the bit line selection transistors in the direction orthogonal to the bit line is determined to have an average larger than b1 and smaller than b2.

The bit lines BLo, BLe and the sensing bit lines SBL can be connected to the corresponding transistor diffusion layers using the lateral intersection wires shown with the dashed lines similar to the preceding embodiments.

Also in this embodiment, the transistor arrangement can be achieved with improved area efficiency while the bit line selection transistors partially differ in number of stages in the bit line direction.

In the examples described in the above embodiments, the sense amps are arranged only at one end of the bit lines. As the bit line pitch is much more finely patterned, the sense amps are often hardly arranged in such the manner. In such the case, it is effective to divide 8 I/Os into two and arrange each 4 I/Os at each of both ends of the bit lines, for example.

As described above, according to the embodiments of the invention, it is possible to provide a semiconductor memory device capable of arranging bit line selection transistors without reduction of the area efficiency.

As an embodiment, an electronic card using the non-volatile semiconductor memory devices according to the above-described embodiments of the present invention and an electronic device using the card will be described bellow.

Figure 10:
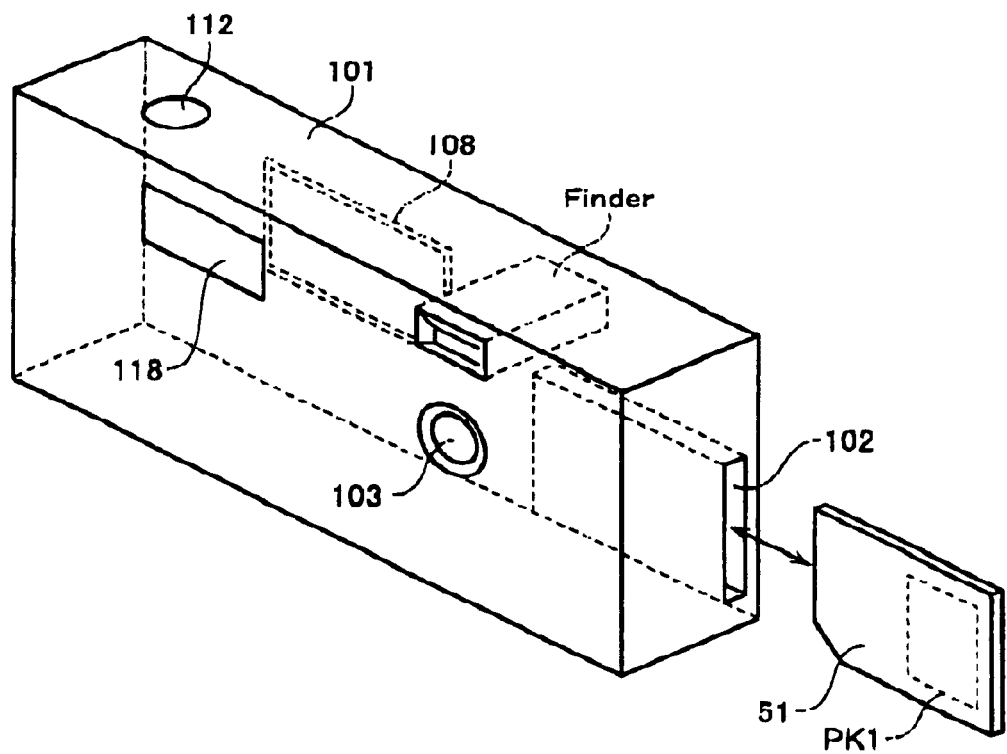
FIG. 10 shows another embodiment applied to a digital still camera.

FIG. 10 shows an electronic card according to this embodiment and an arrangement of an electronic device using this card. This electronic device is a digital still camera 101 as an exemplary portable electronic device. The electronic card is a memory card 51 used as a recording medium in the digital still camera 101. The memory card 51 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 51 is detachably inserted into the card slot 102 of the digital still camera 101. When inserted into the slot 102, the memory card 51 is electrically connected to electric circuits on the circuit board.

If this electronic card is a non-contact type IC card, it is electrically linked to the electric circuits on the circuit board via radio signals when inserted into or approached to the card slot 102.

Figure 11:
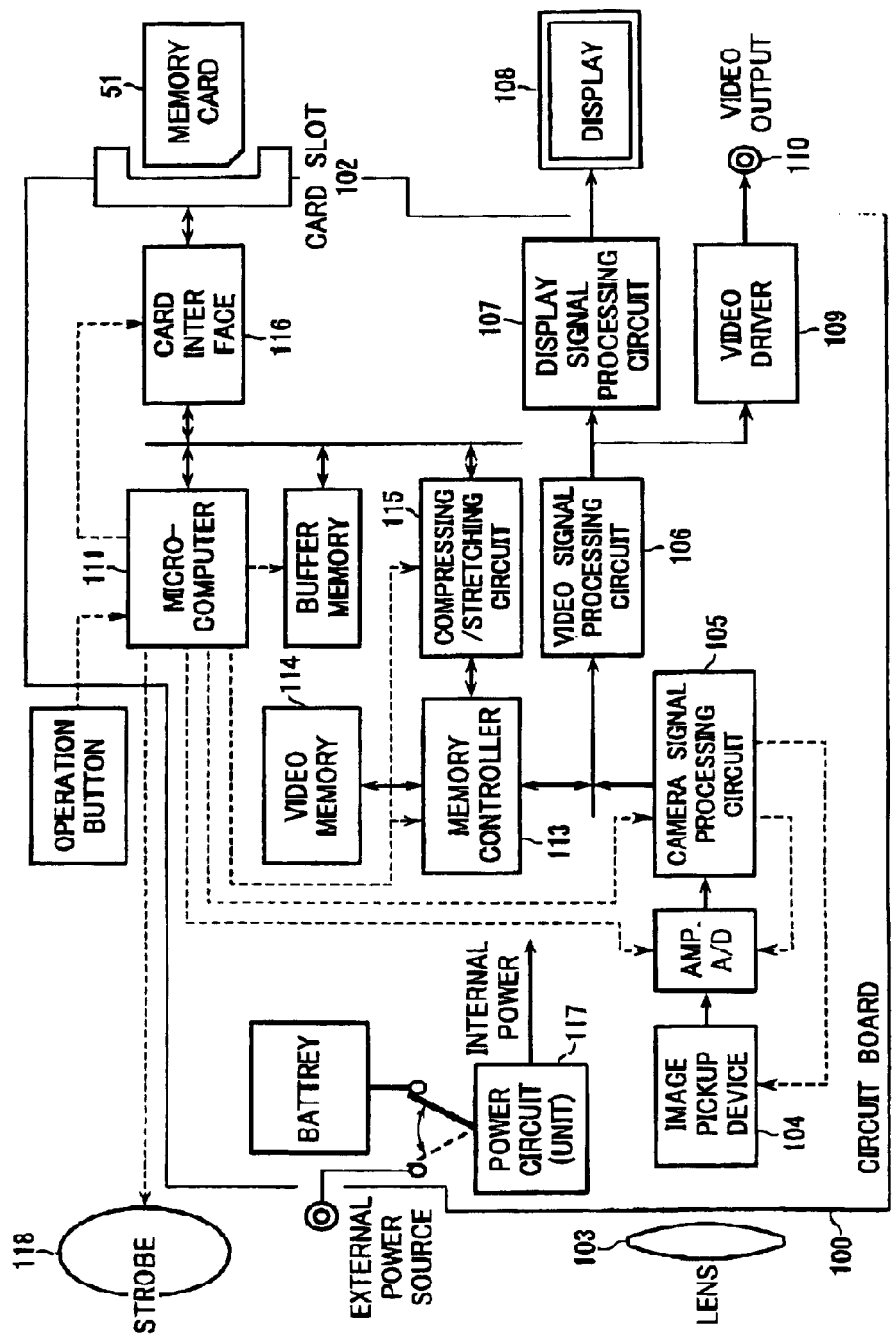
FIG. 11 shows the internal configuration of the digital still camera.

FIG. 11 shows a basic arrangement of the digital still camera. Light from an object is converged through a lens 103 and input to an image pickup device 104. The image pickup device 104 is, for example, a CMOS sensor and photoelectrically converts the input light to output, for example, an analog signal. This analog signal is amplified at an analog amplifier (AMP), and converted into a digital signal at an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., of the NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the picked-up image to be displayed on an image apparatus other than the display 108. A microcomputer 111 controls the image pickup device 104, the analog amplifier (AMP), the A/D converter (A/D), and the camera signal processing circuit 105.

To capture an image, an operator presses an operation button such as a shutter button 112. In response to this operation, the microcomputer 111 controls a memory controller 113 to write the output signal from the camera signal processing circuit 105 into a video memory 114 as a frame image. The frame image written in the video memory 114 is compressed on the basis of a predetermined compression format by a compressing/stretching circuit 115. The compressed image is recorded, via a card interface 116, in the memory card 51 inserted into the card slot.

To reproduce a recorded image, an image recorded on the memory card 51 is read out via the card interface 116, stretched by the compressing/stretching circuit 115, and written into the video memory 114. The written image is input to the video signal processing circuit 106 and displayed on the display 108 or another image apparatus in the same manner as the image is monitored.

In this arrangement, those mounted on the circuit board 100 include the card slot 102, the image pickup device 104, the analog amplifier (AMP), the A/D converter (A/D), the camera signal processing circuit 105, the video signal processing circuit 106, the display signal processing circuit 107, the video driver 109, the microcomputer 111, the memory controller 113, the video memory 114, the compressing/stretching circuit 115, and the card interface 116.

The card slot 102 is not required being mounted on the circuit board 100, and can also be connected to the circuit board 100 via a connector cable or the like.

A power circuit 117 is also mounted on the circuit board 100. The power circuit 117 receives power from an external power source or battery and generates an internal source voltage for use in the digital still camera 101. For example, a DC—DC converter can be used as the power circuit 117. The internal source voltage is supplied to the various circuits described above, in addition to a strobe 118 and the display 108.

Figure 12A:
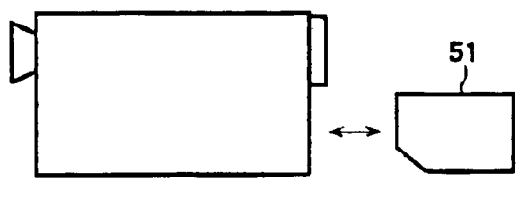
FIGS. 12A to 12J show other electronic devices to which the embodiment is applied.
Figure 12F:
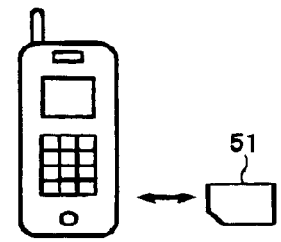
Figure 12B:
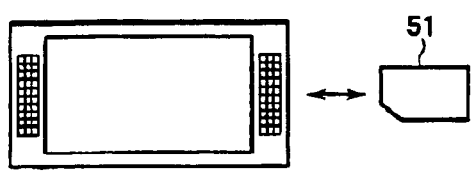
Figure 12G:
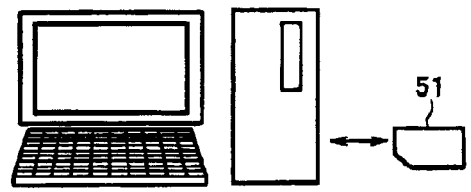
Figure 12C:
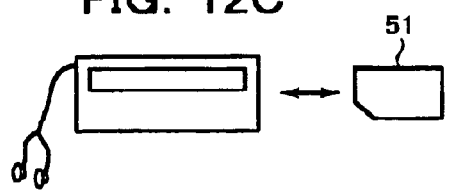
Figure 12H:
Figure 12D:
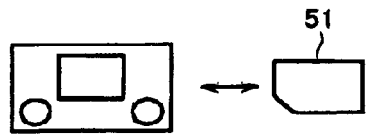
Figure 12I:
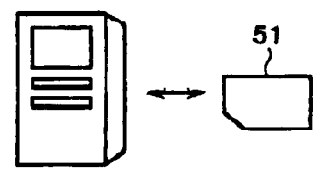
Figure 12E:
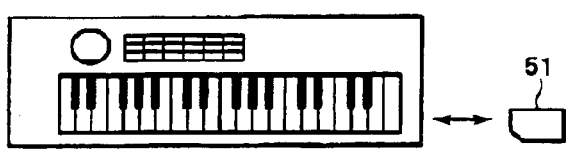
Figure 12J:
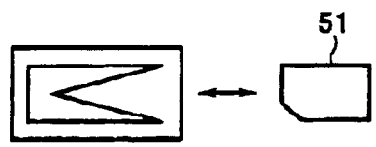

As described above, the electronic card according to this embodiment can be used in portable electronic devices such as the digital still camera explained above. However, the electronic card can also be used in various apparatus such as those shown in FIGS. 12A to 12J, as well as in portable electronic devices. That is, the electronic card can also be used in a video camera shown in FIG. 12A, a television set shown in FIG. 12B, an audio device shown in FIG. 12C, a game machine shown in FIG. 12D, an electronic musical instrument shown in FIG. 12E, a cell phone shown in FIG. 12F, a personal computer shown in FIG. 12G, a personal digital assistant (PDA) shown in FIG. 12H, a voice recorder shown in FIG. 12I, and a PC card shown in FIG. 12J.

The aforementioned embodiments are merely examples and hence do not restrict the present invention. Although a NAND-type flash memory device is explained in the above-described embodiments, the present invention is applicable to, for example, a NOR-type, a DINOR-type, and the like non-volatile semiconductor memory devices.

While the present invention has been particularly shown and described with reference to the embodiments, it will be understood by those skilled in the art that various changes in form and detail may be made without departing from the spirit, scope, and teachings of the invention.

What is claimed is:

1. A semiconductor memory device, comprising:
   a cell array including bit lines arranged at a uniform pitch; and
   a plurality of bit line selection transistors connected to respective bit line ends for selectively connecting said bit line to a sense amp, wherein said bit line selection transistors are translationally arrayed in a direction perpendicular to said bit line at an average array pitch greater than eight times said pitch of said bit lines.

2. The semiconductor memory device according to claim 1, wherein said average array pitch is related to an integer other than said bit line pitch multiplied by a power of 2.

3. The semiconductor memory device according to claim 1, wherein said bit line selection transistors are arrayed in said direction perpendicular to said bit line at two or more different array pitches.

4. The semiconductor memory device according to claim 1, wherein said bit line selection transistors are arrayed on a plurality of stages in the longitudinal direction of said bit line, having two or more different array stages corresponding to positions of said bit lines.

5. The semiconductor memory device according to claim 1, wherein said bit line selection transistors are laid out to have a gate width direction orthogonal to said bit line.

6. The semiconductor memory device according to claim 1, wherein said bit line selection transistors are laid out to have a gate length direction orthogonal to said bit line.

7. The semiconductor memory device according to claim 1, wherein a bit line selection transistor for selecting an even bit line and a bit line selection transistor for selecting an odd bit line adjacent thereto are formed to share a common source/drain diffusion layer, said common source/drain diffusion layer being connected to a sensing bit line that leads to a sense amp shared by said even bit line and said adjacent odd bit line.

8. The semiconductor memory device according to claim 1, wherein said cell array includes electrically erasable programmable non-volatile semiconductor memory cells arrayed.

9. The semiconductor memory device according to claim 8, wherein said non-volatile semiconductor memory cells configure a NAND cell unit including a plurality of serially connected cells, each pair of adjacent cells sharing a source/drain diffusion layer.

10. An electronic card including said semiconductor memory device according to claim 9 mounted thereon.

11. An electronic device, comprising:

a card interface;

a card slot connected to said card interface; and said electronic card according to claim 10 electrically connectable to said card slot.

12. The electronic device according to claim 11, wherein said electronic device comprises a digital camera.

13. A semiconductor memory device, comprising:

a cell array including bit lines arranged at a uniform pitch; and a plurality of bit line selection transistors connected to respective bit line ends for selectively connecting said bit line to a sense amp, wherein said bit line selection transistors are translationally arrayed in a direction perpendicular to said bit line at an average array pitch deviated from an integer multiple of said pitch of said bit lines.

14. The semiconductor memory device according to claim 13, wherein said bit line selection transistors are arrayed in said direction perpendicular to said bit line at two or more different array pitches.

15. The semiconductor memory device according to claim 13, wherein said bit line selection transistors are arrayed on a plurality of stages in the longitudinal direction of said bit line, having two or more different array stages corresponding to positions of said bit lines.

16. The semiconductor memory device according to claim 13, wherein said bit line selection transistors are laid out to have a gate width direction orthogonal to said bit line.

17. The semiconductor memory device according to claim 13, wherein said bit line selection transistors are laid out to have a gate length direction orthogonal to said bit line.

18. The semiconductor memory device according to claim 13, wherein a bit line selection transistor for selecting an even bit line and a bit line selection transistor for selecting an odd bit line adjacent thereto are formed to share a common source/drain diffusion layer, said common source/drain diffusion layer being connected to a sensing bit line that leads to a sense amp shared by said even bit line and said adjacent odd bit line.

19. The semiconductor memory device according to claim 13, wherein said cell array includes electrically erasable programmable non-volatile semiconductor memory cells arrayed.

20. The semiconductor memory device according to claim 19, wherein said non-volatile semiconductor memory cells configure a NAND cell unit including a plurality of serially connected cells, each pair of adjacent cells sharing a source/drain diffusion layer.

21. An electronic card including said semiconductor memory device according to claim 20 mounted thereon.

22. An electronic device, comprising:

a card interface;

a card slot connected to said card interface; and said electronic card according to claim 21 electrically connectable to said card slot.

23. The electronic device according to claim 22, wherein said electronic device comprises a digital camera.

* * * * *